(12) United States Patent
Choi

(10) Patent No.: US 7,800,225 B2
(45) Date of Patent: Sep. 21, 2010

(54) MICROELECTRONIC DIE INCLUDING LOCKING BUMP AND METHOD OF MAKING SAME

(75) Inventor: Seon-ho Choi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 11/761,060

(22) Filed: Jun. 11, 2007

(65) Prior Publication Data

US 2008/0303143 A1 Dec. 11, 2008

(51) Int. Cl.
*H01L 21/302* (2006.01)
(52) U.S. Cl. .................. 257/737; 257/734; 257/738; 257/E21.503; 257/E21.511

(58) Field of Classification Search .......... 257/734–738, 257/772, 777–783; 438/612–615
See application file for complete search history.

(56) References Cited

U.S. PATENT DOCUMENTS 6,365,842 B1 * 4/2002 Jiang ..................... 174/261
6,624,512 B2 * 9/2003 Kurusu .................. 257/737

* cited by examiner

*Primary Examiner*—Dung A. Le
(74) *Attorney, Agent, or Firm*—Blakely, Sokoloff, Taylor & Zafman LLP

(57) ABSTRACT

A microelectronic die and a method of providing same. The die includes a die substrate having an active surfaces and a locking bump on the active surface of the die substrate. The locking bump defines a recess adapted to receive therein a solder bump of a package substrate such that an apex of the solder bump contacts a bottom of the recess.

15 Claims, 3 Drawing Sheets

MICROELECTRONIC DIE INCLUDING LOCKING BUMP AND METHOD OF MAKING SAME

FIELD

Embodiments of the present invention relate generally to the field of microelectronic fabrication, and, in particular to bump configurations on microelectronic dies.

BACKGROUND

As seen in FIG. 1, during a conventional flip-chip attach process, a microelectronic die 10 including conductive bumps 12 thereon, such as copper bumps, for example, is brought into registration with solder bumps 14 on a package substrate 16 having corresponding bumping sites (or surface finish layers) 18 supporting the solder bumps and an optional solder resist layer 19 supported on a substrate panel 15. Typically to move and position and the die and the substrate relative to one another during flip chip attachment, a pick and place tool is used. A pick-and-place tool, as is well known, may include a conveyer system including a rail 5 to move the substrate into and out of a die alignment position, a bond head 21 to move the die into alignment with the substrate a vision system (not shown), etc. After die 10 has been placed onto the substrate 16, the die-substrate combination is typically moved by rail 5 to go to the next process step. When the combination departs from the area of the bond head 21 the combination is subjected to acceleration forces and when the rail stops at the next toot, the combination is subjected to deceleration forces. Such acceleration and deceleration can cause movement of the die with respect to the substrate. The above problem is exacerbated in the case of a large die, such as one having a size above about 10×10 mm, where the inertia of the die is larger for the same acceleration or deceleration. Referring still to FIG. 1, typically, the solder bumps 14 are fluxed with flux 20. The flux serves to remove any residual oxide on the solder bumps prior to die attach. Even though the tackiness of the flux 20 can help to hold the die 10 in place during movement of the rail 5, such tackiness is sometimes not strong enough to counteract the acceleration/deceleration mentioned above.

Prior art copper bumps are known which show dimples on a surface thereof adapted to receive the solder bumps thereon. An example of a dimpled bump is provided in FIG. 2 which, except for the dimple on the die bump, has components identical to those of FIG. 1. As seen in FIG. 2, a small dimple 23 is defined in bump 12. Such dimples are usually brought about as a result of an un-optimized plating process involving the formation of the die bumps. A typical diameter of the dimple is about 10 μm or less, and a typical depth about several micrometers on a die bump having a diameter of about 105 μm and a height of about 47 μm. After placement of die 10 onto substrate 16, flux 20 provided on the solder bumps 14 of the substrate 16 may get trapped in the dimple 23 due to surface tension of the flux, and also as a result of a plugging effect of the solder bumps 14. Flux entrapment as described above, however, may lead to voids within solder joints formed to bond the die to the substrate, in this way resulting in poor yield and/or poor performance of the die-substrate package. The entrapped flux reduces the mechanical and electrical integrity of the joints to be formed between the die and the substrate. Entrapped flux in a solder joint reduces the mechanical stress level that can be sustained by the joint, and also reduces the area of current path, in this way resulting in a reduced current carrying capability of the joint. Another disadvantage of having a solder void induced by flux entrapment is a current crowding effect around the void which would accelerate electromigration and possibly lead to early failure of the joint.

The prior art fails to provide a reliable solution for the misalignment of microelectronic dies with respect to package substrate.

Figure 1:
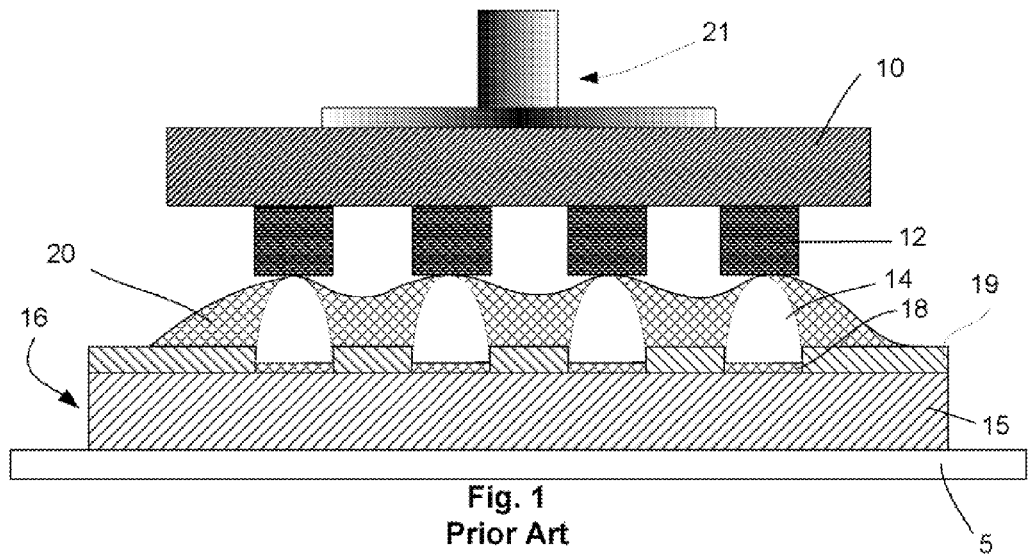
FIGS. 1 and 2 depict two different configurations of die-substrate combinations at the time of die alignment according to the prior art.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic die having a locking bump, and a method of providing the die are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

Aspects of this and other embodiments will be discussed herein with respect to FIGS. 3a-5c below. The figures, however, should not be taken to be limiting, as it is intended for the purpose of explanation and understanding.

Figure 3A:
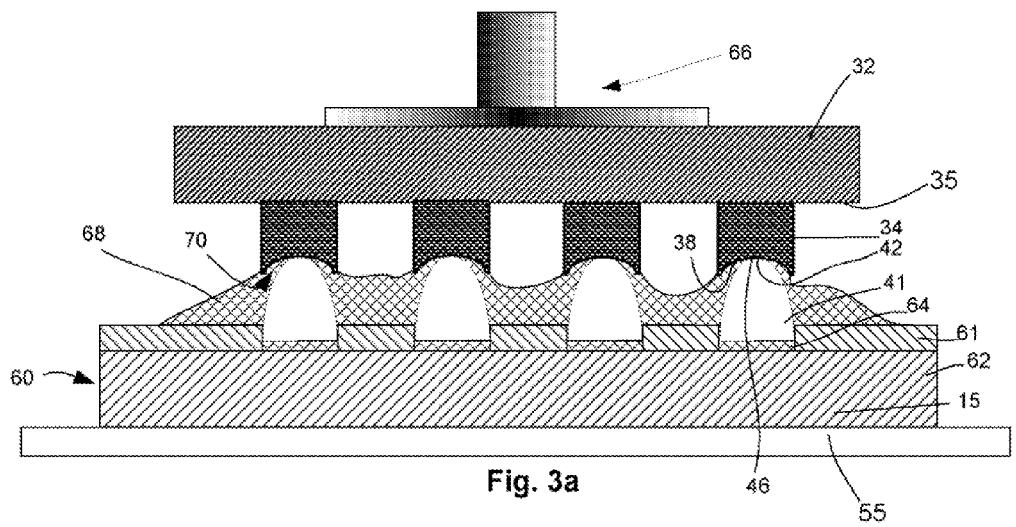
FIGS. 3a and 3b depict respective first and second embodiments of a microelectronic die in respective die-substrate combinations similar to those of FIG. 1 and/or FIG. 2.
Figure 3B:
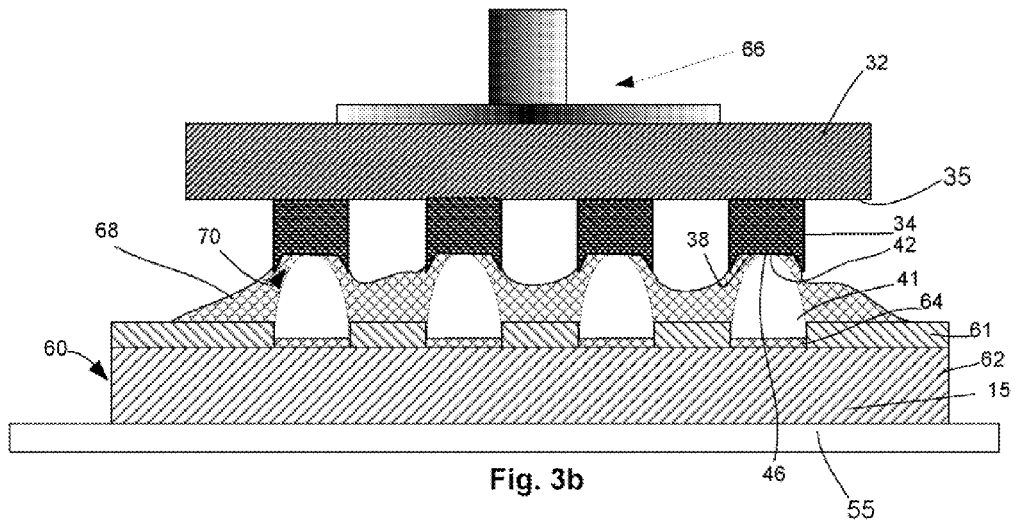
Figure 4A:
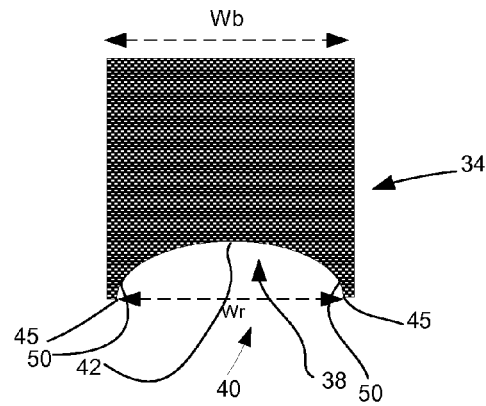
FIGS. 4a and 4b depict respective first and second embodiments of a locking bump as respectively used in FIGS. 3a and 3b.
Figure 4B:
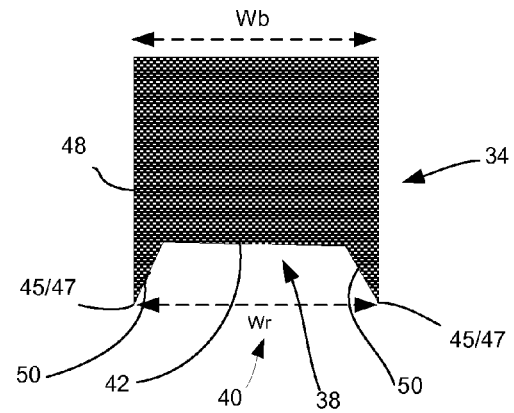
Figures 5A, 5B, 5C:
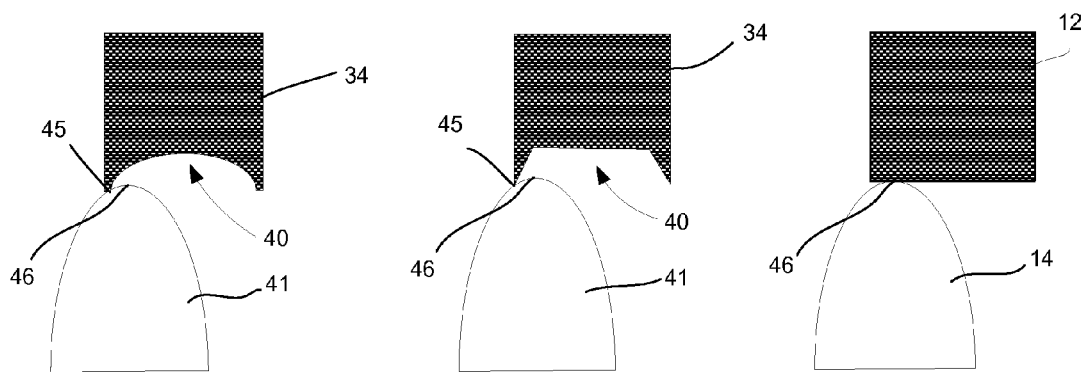
FIGS. 5a and 5b depict respective die bump/solder bump combinations in a state of misalignment owing to a differential thermal expansion between die and substrate during reflow where the die bump is configured, respectively, according to the first embodiment and the second embodiment.
FIG. 5c is a view similar to FIG. 5a or 5b showing a die bump/solder bump combination in a misaligned state where the die bump is configured according to the prior art.

Referring now to FIGS. 3a, 4a and 5a on the one hand, and FIGS. 3b, 4b and 5b on the other hand, respective first and second embodiments are shown of locking bumps, as will be explained in further detail below. A difference between the first embodiment as shown in FIGS. 3a, 4a and 5a on the one hand, and the second embodiment as shown in FIGS. 3b, 4b and 5b on the other hand, resides in that, in the first embodiment, the locking bump defines a recess having a concave surface, while, in the second embodiment, the locking bump defines a recess having an angled surface.

Figure 2:
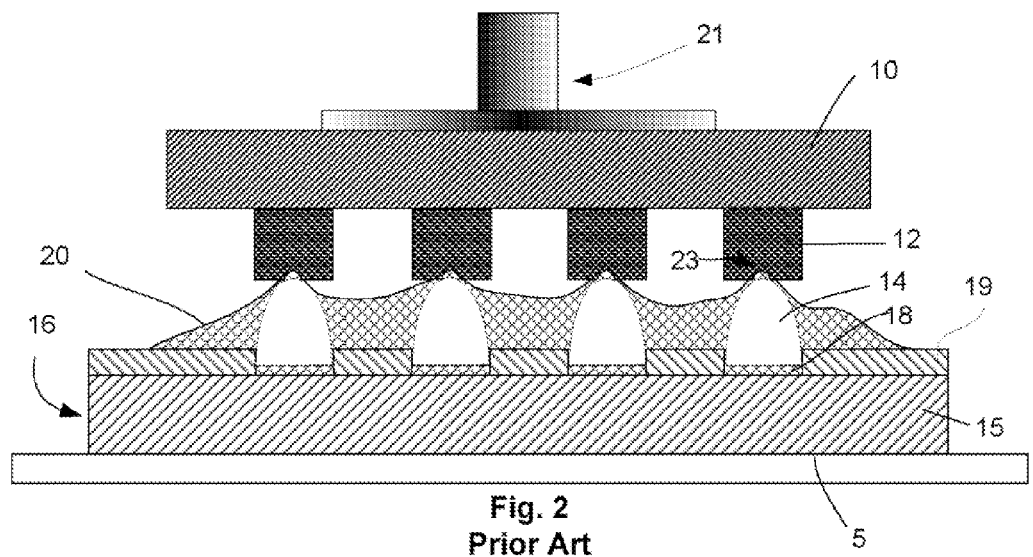

In the shown embodiments, similar to the depictions of the prior art in FIGS. 1 and 2 described above, a microelectronic die 32 is shown as having been aligned to a solder-bumped substrate 60. The solder-bumped substrate 60 includes a substrate panel 62, a solder resist layer 61 on the substrate panel, a plurality of bumping sites 64 on the substrate panel, and solder bumps 41 on respective ones of the bumping sites. The die 32 is aligned to the extent that each of the die bumps 34 is registered with a corresponding one of the solder bumps 41 before flip chip attachment of the die to the substrate by way of solder reflow. An alignment of the die 32 is shown schematically as being effected by a conventional bond 66 which moves the die 32 into alignment with the substrate 60. The substrate 60 is supported for movement on a rail 55 similar to rail 5 of FIGS. 1 and 2. As shown, flux 68 may be provided onto the solder bumps 41. As noted previously, the flux serves to remove any residual oxide on the bumping sites prior to die attach.

Referring still by way of example to FIGS. 3a, 4a and 5a on the one hand, and 3b, 4b and 5b on the other hand, according to embodiments, microelectronic die 32 includes a die substrate 32 and at least one locking bump 34 on an active surface 35 the die substrate. By "locking bump . . . on a die substrate," what is meant in the context of embodiments is: (1) a conductive bump on the active surface of the die substrate adapted to allow a flip chip mounting of the die to external circuitry such as to solder bumps of a package substrate; and (2) where the conductive bump is configured to limit, after die alignment to the substrate, a movement of the die with respect to the package substrate in a direction parallel to an active surface of the die during movement of a combination of the die and substrate to a process stage subsequent to alignment. Conductive bumps according to (1) above are well known, and may include one or more metalization layers such as, for example, layers including Cu, Al or Ag. Preferably, the conductive bumps may further include a barrier layer provided as a last covering layer of the bump, such as for example, a layer comprising nickel, in order to prevent a migration of electrically conductive material from the bump, as is recognized by persons skilled in the art. It is noted that embodiments comprise within their scope the provision of additional layers not described above as part of the bump metallization layers as would be within the knowledge of one skilled in the art. With respect to (2) above, a locking bump according to embodiments includes a surface 38 defining a recess 40 adapted to receive therein a solder bump 41 of a package substrate 60 such that an apex 46 of the solder bump contacts a bottom of the recess. By a "bottom" of the recess, what is meant in the context of embodiments is a portion of the surface defining the recess which extends substantially parallel to the active surface of the die. In the shown embodiments of FIGS. 3a and 4a on the one hand, and 3b and 4b on the other hand, the bottom is indicated in each case with reference numeral 42. Preferably, as depicted with respect to the first and second embodiments, more than one of the die conductive bumps are locking bumps. Most preferably, again as depicted in the figures, all of the die conductive bumps are locking bumps. According to embodiments, a locking bump as defined above may be provided using one of many well known techniques for providing die conductive bumps, such as, for example, by way of electro-plating, chemical or plasma etching from the top surface of the bump. In addition, it is possible to make the shown bump shape by mechanical machining or laser melting. For example, where electroplating is used, plating parameters may be adjusted in a well known manner to yield the desire bump shapes, as would be recognized by one skilled in the art.

According to some embodiments, as best seen in FIGS. 4a and 4b, the recess 40 includes a rim 45 having a width Wr that is at least about 70% of a width Wb of the bump. The "rim" as used herein refers to regions of the surface 38 furthest from the active surface 35 of the die. According to embodiments, the rim 45 is wide enough to allow an apex 46 of a corresponding solder bump 41 to contact the bottom 42 of the recess 40. According to some embodiments, as shown by way of example in FIG. 4b, rim 45 of the recess 40 may have a width Wr that is substantially coextensive with a width Wb of the bump. In such a case, the rim 45 includes an apex 47 which is formed by a joinder or meeting between the surface 38 defining the recess and side surfaces 48 of the bump. Although a substantially coextensive rim has been shown herein only in the context of the second embodiment, it is to be understood that embodiments are not so limited, and that a substantially coextensive rim may be provided with respect to the first embodiment as well.

Referring now in particular to the first embodiment as depicted in FIGS. 3a, 4a and 5a, and as best seen in FIG. 4a, the surface 38 defining the recess may be a concave surface. A curvature of the concave surface may preferably be selected such that, during flip chip mounting of the die 32 to the substrate 60, the apex 46 of the solder bump 41 adapted to be received within the concave surface 38 contacts the bottom surface 42 of the same, and, at the same time, a clearance 70 (FIG. 3a) is defined between tapered side surfaces 50 of concave surface 38 and a surface of the solder bump 41. Thus, preferably, a curvature of the concave surface 38 may be selected to be less than a curvature of the top region of the solder bumps. The clearance 70 would be useful in allowing flux 68 to escape from recess 40 during alignment, thus avoiding trapped flux problems of the prior art described above. The curvature of the bump recesses is preferably smaller than that of solder bumps, preferably by about 20% or more.

Referring now in particular to the second embodiment as depicted in FIGS. 3b, 4b and 5b, and as best seen in FIG. 4b, the surface 38 defining the recess may be an angled surface. In the particular embodiment shown, the angled surface includes a flat bottom surface 42 substantially parallel to active surface 35 of the die 32, and flat tapered side surfaces 50 extending from the flat/bottom surface 42 away from the active surface 35. Dimensions for the bottom surface 42 and tapered side surfaces 50 may preferably be selected such that, during flip chip mounting of the die 32 to the substrate 60, the apex 46 of the solder bump 41 adapted to be received within the angled surface 38 contacts the bottom surface 42 of the same, and, at the same time a clearance 70 (FIG. 4b) is defined between tapered side surfaces 50 of angled surface 38 and a surface of the solder bump 41. The clearance 70 would be useful in allowing flux 68 to escape from recess 40 during alignment, thus avoiding trapped flux problems of the prior art described above.

Referring now to the specific depictions of FIGS. 5a, 5b and 5c, one of the many advantages of providing locking bumps according to embodiments is that the configuration of such locking bumps allows a self alignment between the solder bumps 41 and the die bumps 34: such as in the event of a differential thermal expansion between the die and the substrate during flip chip attachment or initial offset after placement of the die at the pick-and-place tool. All of FIGS. 5a, 5b and 5c depict die bump and solder bump combinations exhibiting misalignment therebetween as a result of an initial offset after placement of the die onto the substrate. FIGS. 5a and 5b represent such a misalignment in relation to, respectively, the first and second embodiments. FIG. 5c, however, represents such a misalignment with respect to the prior art between solder bump 14 and die bump 12. Even in the relatively extreme cases of misalignment as depicted in FIGS. 5a-5c, where the very rim 45 of the recess 40 is sitting on the apex 46 of the solder bump 41, die bump-solder bump combinations according to embodiments, as depicted by way of example in FIGS. 5a and 5b, allow self-alignment of the noted combinations by virtue of the presence of the recess 40. Self-alignment may occur if there is small disturbance or vibration during movement on a conveyer rail because there would be sliding between the respective surfaces of the solder bumps and recesses. This would be true as long as the center line of the solder bump 41 has not moved beyond the rim 45. However, as clear from FIG. 5c the prior art would not allow such a self-alignment to take place. In the circumstances depicted in FIGS. 5a, 5b and 5c, a surface tension of any flux on the bumps 41 would not be a factor in determining whether self-alignment would occur.

Advantageously, embodiments provide a die bump structure adapted to limit a movement of the die in a direction parallel to an active surface thereof during alignment of the die onto the substrate, in this way reducing yield loss associated with die misalignment from an acceleration/deceleration of a pick-and-place device for the die, and thus improving flip chip attach through-put. In addition, embodiments allow the use of fluxes having reduced viscosity as compared with prior art fluxes, in this way helping to prevent flux entrapment. The flux may be made less viscous to the extent that the locking feature of the locking bump would obviate the need for a more viscous flux to hold the die in alignment onto the package substrate. Additionally, advantageously, embodiments make possible a self-alignment between die bump and solder bump combinations, such as in the case of an initial offset during die placement as explained in further detail above with respect to FIGS. 5a, 5b and 5c.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic die comprising:
   a die substrate having an active surface; and
   a locking bump on the active surface of the die substrate, the locking bump defining a recess including a bottom surface and tapered side surfaces which extend away from the bottom surface, such that the recess is adapted to receive therein a solder bump of a package substrate such that an apex of the solder bump contacts the bottom surface of the recess and a clearance exists between the solder bump and the tapered side surfaces, wherein said recess is larger than said apex.

2. The die of claim 1, further comprising a plurality of locking bumps, the locking bump being one of said plurality of locking bumps.

3. The die of claim 1, wherein the recess is concave.

4. The die of claim 1, wherein the tapered side surfaces are angled surfaces.

5. The die of claim 4, wherein the bottom surface has a flat surface parallel to an active surface of the die and said angled side surfaces extend away from the active surface.

6. The die of claim 1, wherein the recess includes a rim.

7. The die of claim 6, wherein, the rim includes an apex formed by a joinder between the tapered side surfaces defining the recess and side surfaces of the bump.

8. The die of claim 6, wherein the recess is configured such that, when the solder bump is received therein, a clearance is defined between the rim and the solder bump.

9. A method of providing conductive bumps on an active surface of a microelectronic die substrate comprising providing a locking bump on the active surface, the locking bump defining a recess including a bottom surface and tapered side surfaces which extend away from the bottom surface, such that the recess is adapted to receive therein a solder bump of a package substrate such that an apex of the solder bump contacts a bottom of the recess and a clearance exists between the solder bump and the tapered side surfaces, wherein said recess is larger than said apex.

10. The method of claim 9, wherein the recess is concave.

11. The method of claim 9, wherein the tapered side surfaces are angled surfaces.

12. The method of claim 11, wherein the bottom surface has a flat surface parallel to an active surface of the die and said angled side surfaces extend away from the active surface.

13. The method of claim 9, wherein the recess includes a rim.

14. The method of claim 13, wherein the rim including an apex formed by a joinder between the tapered side surfaces defining the recess and side surfaces of the bump.

15. The method of claim 13, wherein the recess is configured such that, when the solder bump is received therein, a clearance is defined between the rim and the solder bump.

* * * * *